United States Patent [19]

Tucker

[11] Patent Number: 5,440,577
[45] Date of Patent: Aug. 8, 1995

[54] SEMICONDUCTOR LASER

[75] Inventor: Rodney S. Tucker, Victoria, Australia

[73] Assignee: The University of Melbourne, Victoria, Australia

[21] Appl. No.: 295,041

[22] Filed: Aug. 25, 1994

Related U.S. Application Data

[63] Continuation of Ser. No. 104,109, Dec. 8, 1993, abandoned.

[30] Foreign Application Priority Data

Feb. 13, 1991 [AU] Australia ................... PK4591
Aug. 28, 1991 [AU] Australia ................. 83439/91

[51] Int. Cl.⁶ ............................................. H01S 3/19
[52] U.S. Cl. ................................... 372/50; 372/45
[58] Field of Search ............... 372/44, 45, 50; 257/91, 257/93

[56] References Cited

FOREIGN PATENT DOCUMENTS 56-134792 10/1981 Japan.
63-306687 12/1988 Japan.

*Primary Examiner*—Rodney B. Bovernick
*Assistant Examiner*—Robert E. Wise
*Attorney, Agent, or Firm*—Nixon & Vanderhye

[57] ABSTRACT

A semiconductor laser comprises a plurality of laser sections (10, 11, 12) defined in a body and isolated electrically from one another. The active region (14) of each section are optically coupled together and electrical connections (9) connect the sections in series and provide connections to an external drive current source. In a practical embodiment the laser is constructed in planar form in a body (16) of semi-insulating material and wells (23a, 23b, 23c) are etched into the body and are provided with metallization (24) which forms the electrical connections. The active region (14) extends continuously through the body with separate p-type anodes thereabove and separate n-type cathodes beneath the active region and extending on either side thereof.

11 Claims, 3 Drawing Sheets

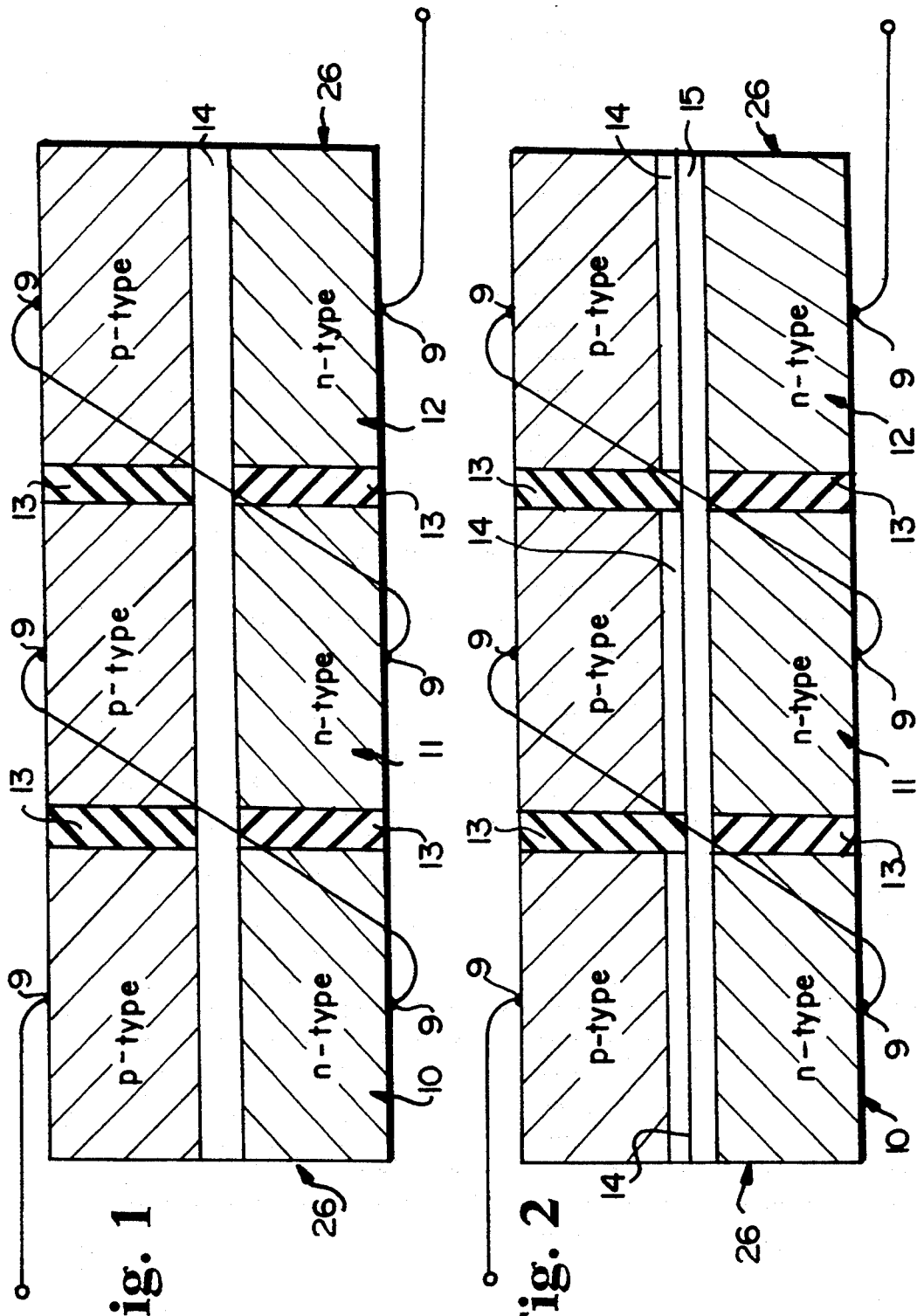

SEMICONDUCTOR LASER

This is a continuing application of application Ser. No. 08/104,109, filed 08 Dec. 1993, now abandoned.

This application is a 371 of PCT U.S. Ser. No. 92/00048 filed on Feb. 12 1992.

This invention relates to a semiconductor laser and more particularly to an improved semiconductor laser having low threshold current and high external quantum efficiency.

Most known semiconductor lasers comprise a single semiconductor chip with a pair of electrical contacts. One of these contacts connects to p-type material on one side of an internal junction diode and the other contact connects to n-type material on the other side of the internal junction diode. The laser is operated with the p-type (or anode) contact connected to a supply voltage which is positive with respect to the n-type (or cathode) contact, such that the internal junction is forward biased. Current pumped or injected into the forward-biased junction causes the carrier density in the active layer of the laser to increase, thereby increasing the optical gain in the active layer. The active layer is generally restricted to a narrow stripe to confine the carriers, and the optical field is usually constrained to the region of the active stripe by a waveguide structure. The terminal current at which the optical gain in the laser is just sufficient to produce an onset of lasing action is called the threshold current. If the terminal current is increased beyond this threshold current, the light output from the laser increases sharply.

There have been a number of reports of multi-section semiconductor lasers with multiple sections along the length of the active region. These lasers include cleaved-coupled cavity lasers, multi-section distributed feedback lasers, tuneable distributed Bragg reflector lasers and gain-levered lasers. These lasers generally have more than one p-type (or anode) contact, but share the same n-type (or cathode) contact. The method of driving these lasers depends on the particular application. However, in multiple-section lasers reported to date, the multiple sections in the laser are driven electrically with separate drive currents for each section. Since the separate sections along the length of the active region of these lasers operate in parallel, the total threshold current of the multi-section device is essentially the sum of the currents of the individual sections at the onset of lasing.

Two important requirements of semiconductor lasers for many applications are that they have (a) a low threshold current, and (b) a high external quantum efficiency (defined as the ratio of the total number of emitted photons per unit time to the number of electrons injected into the device through the external contacts per unit time). In previous semiconductor laser designs, the threshold current and quantum efficiency have been limited by the fact that each electron injected into the device produces at most one carrier (i.e. hole-electron pair) in the active region. Each carrier can produce, at most, one photon. For this reason, the external quantum efficiency in most previous designs has been no greater than 100%.

In applications requiring the laser to be modulated by an electrical input signal with frequency components at very high frequencies (1 GHz and higher), it is often necessary to impedance match the laser to the electrical signal source. Many electrical signal sources in this frequency range have an output with a characteristic impedance of 50 ohms. Thus, for good impedance match to a laser, the laser should have an input resistance of 50 ohms. However, conventional semiconductor lasers have an input resistance of the order of 1-5 ohms, made up of a junction resistance of less than 1 ohm and series contact resistance of 1-5 ohms. A common solution to this impedance matching problem is to connect a 47-ohm resistor in series with the laser. This solution provides a reasonable impedance match, but is inefficient as most of the RF signal power is lost in the resistor as heat.

For a more detailed commentary on prior art semiconductor lasers, reference may be made to the following publications, the entire contents of which are incorporated herein by reference.

1. I. P. Kaminow and R. S. Tucker, "Mode-controlled semiconductor lasers", in Guided-Wave Optoelectronics, Ed. T. Tamir, Springer Verlag, Berlin, 1988.
2. J. E. Bowers and M. A. Pollack, "Semiconductor lasers for telecommunication", in Optical Fiber Telecommunications II, Ed. S. E. Miller and I. P. Kaminow, Academic Press, San Diego, 1988.
3. G. P. Agrawal and N. K. Dutta, "Long-Wavelength Semiconductor Lasers", Van Nostrand Reinhold, New York, 1986.
4. W. T. Tsang, N. A. Olsson, and R. A. Logan, "High-speed direct single-frequency modulation with large tuning rate and frequency excursion in cleaved-coupled cavity semiconductor lasers," Appl. Phys. Lett., Vol. 42, pp. 650-652, 1983.
5. M. Kuznetsov, L. W. Stulz, T. L. Koch, U. Koren, and B. Tell, "Tuneable two-segment distributed feedback lasers," Electron. Lett., Vol. 25, pp. 686-687, 1989.
6. H. Shoji, Y. Arakawa, and Y. Fujii, "New bistable wavelength switching device using a two-electrode distributed feedback laser," IEEE Photon. Technol. Lett., Vol. 2, pp. 109-110, 1990.
7. T. L. Koch, U. Koren, R. P. Gnall, C. A. Burrus, and B. I. Miller, "Continuously tuneable 1.5 micron multiple-quantum-well GaInAs/GaInAsP distributed Bragg reflector lasers," Electron. Lett., Vol. 24, pp. 1431-1433, 1988.
8. D. Gajic and K. Y. Lau, "Intensity noise in the ultrahigh efficiency tandem-contact quantum well lasers," Proceedings, Conference on Lasers and Electrooptics, Anaheim, Calif., 21-25 May 1990. pp. 362-364.
9. R. S. Tucker, "High-speed modulation of semiconductor lasers," J. Lightwave Technol., Vol. LT-3, pp. 1180-1192, 1984.
10. J. Schlafer and R. B. Lauer, "Microwave packaging of optoelectronic components," IEEE Trans. Microwave Theory Tech., Vol. 38, pp. 518-523.
11. Y. Arakawa and A. Yariv, "Quantum well lasers—gain, spectra dynamics," IEEE J. Quantum Electron., Vol. 22, pp. 1887-1899, 1986.
12. T. Saitoh and T. Mukai, "Recent progress in semiconductor laser amplifiers", J. Lightwave Technol., Vol. 6, pp. 1656-1664, 1988.
13. M. Gustavsson, A. Karlsson, and L. Thylen, "Travelling wave semiconductor laser amplifier detectors," J. Lightwave Technol., Vol. 8, pp. 610-617, 1990.

An object of this invention is to provide an improved semiconductor laser which overcomes or avoids the limitations of known semiconductor lasers by having a lower threshold current and higher external quantum efficiency.

Accordingly, the invention provides a semiconductor laser comprising:
- a body of semiconductor material;
- plural double hetero junction laser sections defined in said body, said laser sections being electrically isolated from one another within said body, each of said plural laser sections having an active region, said active regions being optically coupled together; and
- connecting structure which electrically connects said plural laser sections together in series.

According to another form the invention provides a semiconductor laser comprising:
- a body of semiconductor material;
- a first laser section defined in said body, said first laser section including a first n-layer and a first p-layer forming a first double hetero junction a first active region being disposed at said first double hetero junction;
- a second laser section defined in said body, said second laser section including a second n-layer and a second p-layer having a second p-n junction therebetween, a second active region being disposed at or said second double hetero junction, said second active region being closely optically coupled to said first active region;
- isolating structure disposed in said body for electrically isolating said first n-layer from said second n-layer; and
- means for electrically coupling said first p-layer to said second n-layer.

In a still further form the invention provides a semiconductor laser comprising:
- a body of semiconductor material;
- plural laser sections defined in said body, said laser sections comprising a stack of layers of semiconductor material forming a vertical-cavity surface emitting device, each of said plural laser sections having an active region, said active regions being optically coupled together; and
- connecting structure which electrically connects said plural laser sections together in series.

In order that the invention may be more readily understood, specific embodiments will now be described with reference to the accompanying drawings wherein:

FIG. 1 is a schematic sectional side elevation of a semiconductor laser according to one embodiment of the invention;

FIG. 2 is a view similar to FIG. 1 of a modification to the embodiment shown in FIG. 1;

Figure 3A:
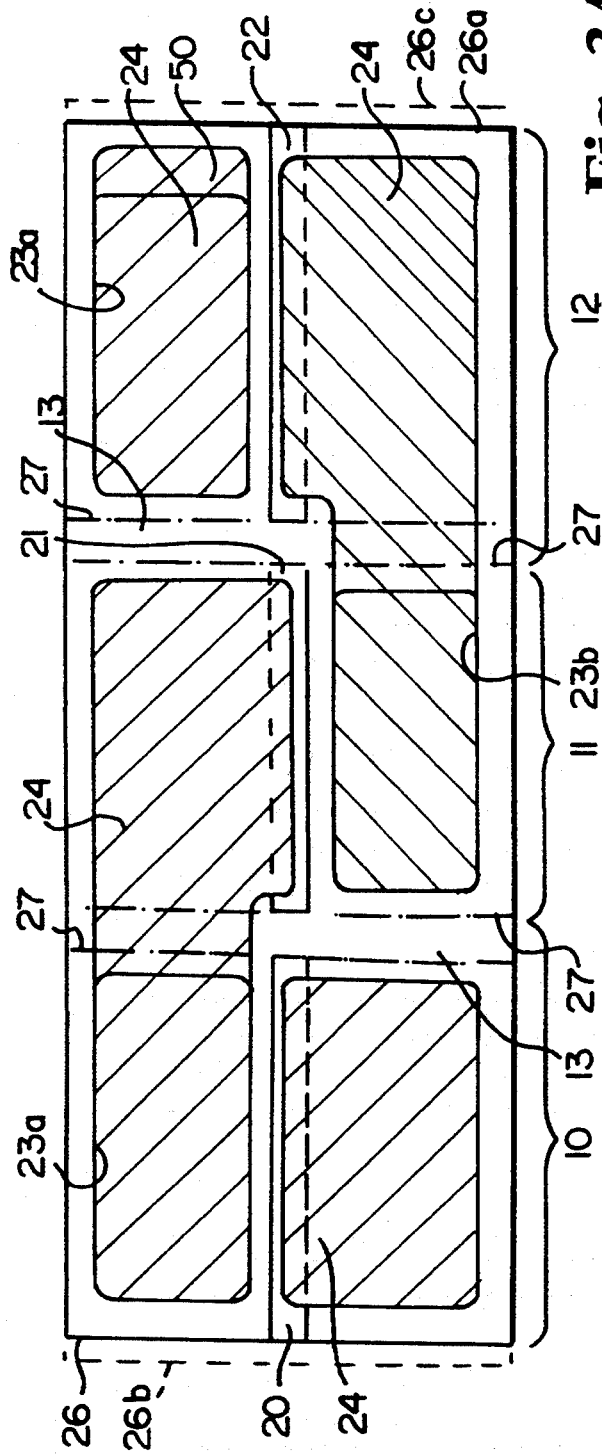
FIG. 3a is a schematic plan view of a semiconductor laser according to a further embodiment of the invention.

FIG. 1 shows the basic structure of the laser. The illustration shows a cross section of the laser for n=3 (three sections). The three sections 10, 11 and 12 are isolated electrically from one another by short sections of semi-insulating or insulating material 13 between the p-type material on the anode sides of the three sections, and between the n-type material on the cathode sides of the laser. The cathodes of sections 10 and 11 are cross-connected to the anodes of sections 11 and 12 respectively. The various connections are made to the anodes and cathodes by ohmic contacts 9. The active region or layer 14 and its associated optical waveguide is shown in FIG. 1 as being continuous throughout the length of the laser. This requires short spacing between the three sections of the laser in order to minimise optical losses in the unpumped regions between sections. Alternatively, the active region 14 of the laser could be closely coupled to a passive waveguide 15 (FIG. 2) along the entire length of the device using techniques recently developed for the fabrication of tuneable distributed Bragg reflector lasers and other integrated photonic devices. This close coupling provides a low loss transfer of optical power from the active region of one section to the passive waveguide and back to the active region of the next adjacent section. With this approach the material of active region 14 could be etched away from the passive waveguide 15 in the spaces between the sections, thereby eliminating losses caused by unpumped active material.

Figure 3B:
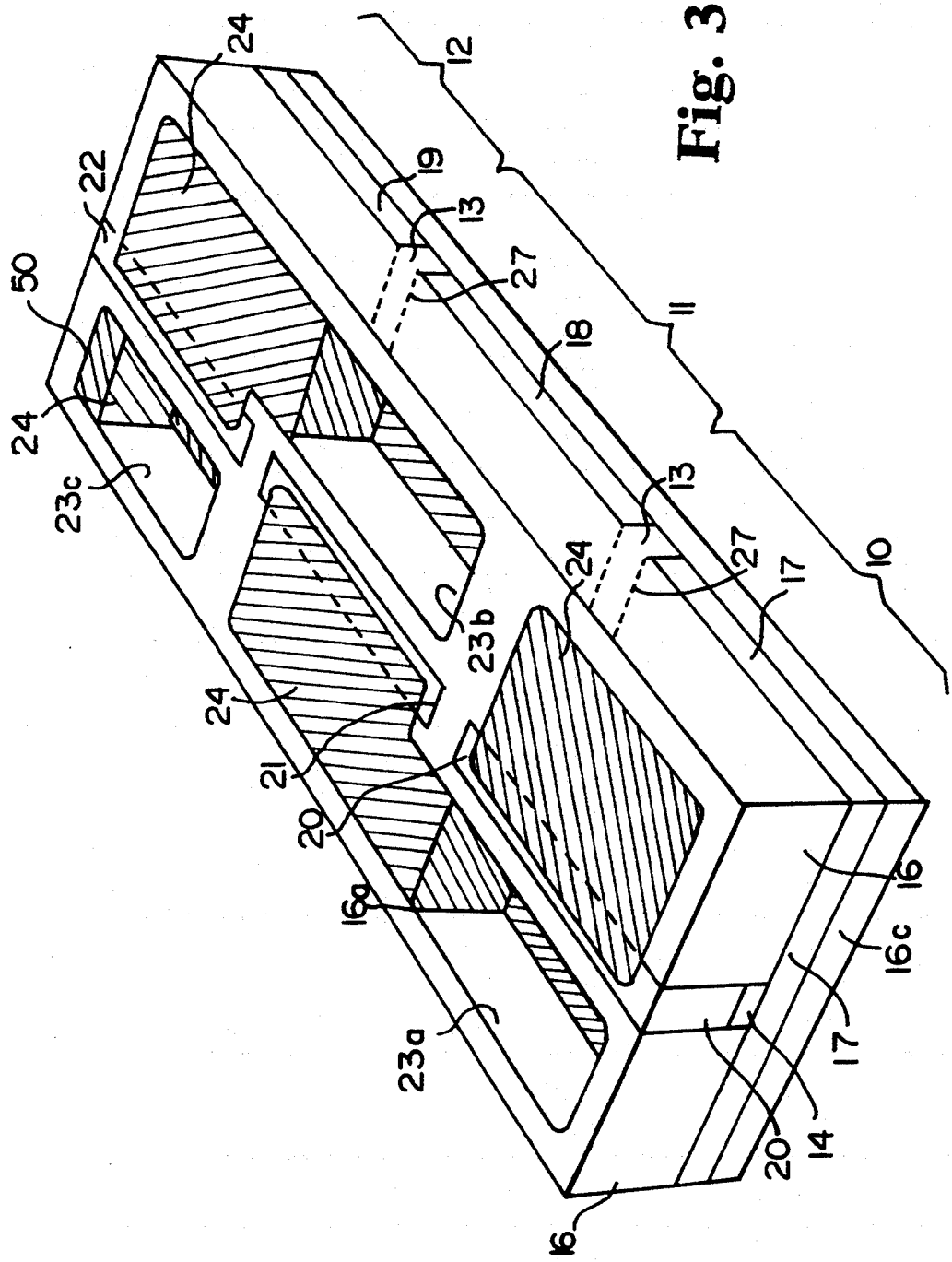
FIG. 3b is a schematic perspective view of the laser of FIG. 3(a)

FIGS. 3(a) and 3(b) show a further embodiment of the invention wherein the laser is shown in more detail and is constructed in planar form, and wherein the junction plane is parallel to the semiconductor crystal surface 16a. The device is fabricated in a semi-insulating body 16 to provide electrical isolation between the n-type cathode regions 17, 18 and 19 under each section 10, 11, 12, respectively. The body is formed on a semi-insulating substrate 16c. Conventional ohmic contacts are made to the p-type material at the anodes 20, 21 and 22 of each section, respectively. The n-type material at the cathode of each section lies partially beneath the active region 14 and extends on both sides of the active region. On one side the n-type material extends beneath well 23a, 23b or 23c, and on the other side the n-type region extends under the semi-insulating region 16 and the contact metalization 24 which has an ohmic contact to the p-layer (this is clearly visible in FIG. 3(b)). The wells 23a, 23b, 23c are etched down through the semi-insulating body 16 on alternate sides of the active region 14 to provide access to the n-type layers 17, 18 and 19, and conventional ohmic contacts are made to the n-type layers at the bottom of the wells. Region 14 could include a passive waveguide as described above to closely couple optical power from one section to the next, or short spacing between the active regions can be used to provide low loss optical coupling between the active regions of adjacent sections. The metalization 24 is used to connect each of the n-type layers 17, 18 and 19 to the appropriate p-type layers 20, 21 and 22 on adjacent sections. The metalization 24 connected to the n-type layer 19 in section 12 connects to the n-contact bonding pad 50 for the laser, and the metalization layer 24 with an Ohmic contact to the p-type material in section 10 is the p-contact bonding pad for the laser. The metalization layer 24 above section 10 forms a bonding pad similar to the pad 50. End facets 26 and 26a occur at opposite ends of the laser and the dotted lines 27 represent the boundaries of the buried n-type layers.

For simplicity the laser shown schematically in FIGS. 1-3 is a Fabry Perot device which is discussed in publications 1-3 hereinabove and which has no provision for control of the optical spectrum. However, the design principals of the laser of this invention can be applied to semiconductor lasers with built-in wavelength control structures, such as distributed feedback lasers and distributed Bragg reflector lasers. The semiconductor material in the active layer or region can be bulk material such a GaAs or InGaAsP (depending on the design wavelength of operation), or quantum-well material. Quantum well-lasers offer the potential of reduced threshold currents compared with lasers using bulk material in the active layer, and the laser provided by this invention will further reduce this threshold current by a factor of n (where n is the number of isolated laser sections). The semiconductor material in the active layer would normally be grown using a conventional epitaxial growth technique such as vapour phase epitaxi (VPE), molecular beam epitaxi (MBE), or metal-organic vapour phase epitaxi (MOVPE). The electrical isolation between the n-type cathode regions 17, 18 and 19 would be made using conventional processing technology. For example, the n-type cathode regions could be initially fabricated in one continuous layer and then isolated by doping or implanting p-type material or other dopants in the isolation layers in order to make the intervening material semi-insulating and therefore isolate the n-type cathode regions.

The laser shown in FIGS. 3(a) and 3(b) has a planar structure, in which the junction plane is parallel to the semiconductor crystal surface 16a. An alternative embodiment (not shown) would be to use a transverse junction structure. In a transverse junction device, the structure would be similar to that shown in FIG. 3, but with a different junction geometry.

Figure 4:
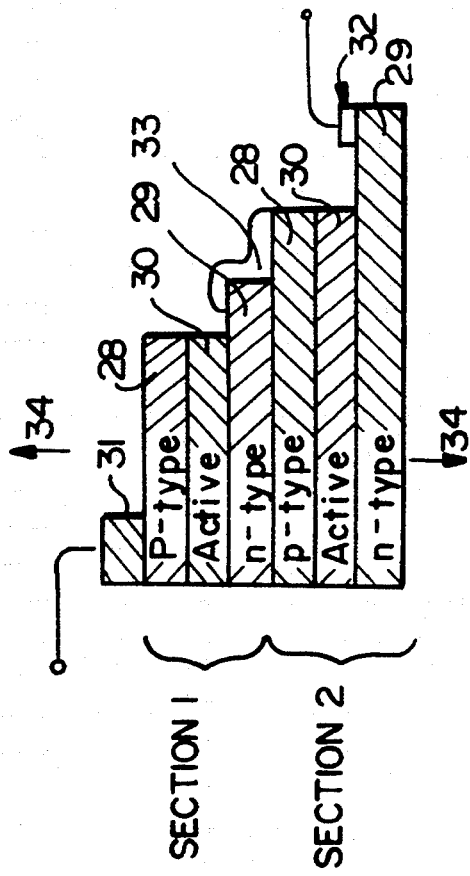
FIG. 4 is a cross-sectional view of a semiconductor laser according to a third embodiment of the invention.

A third embodiment of the invention is shown in FIG. 4. In this case the laser is a vertical-cavity surface-emitting device, and the light propagates through the device in a direction which is normal to the junction plane. FIG. 4 is a cross-section of the device, at right angles to the planes of the individual junctions. The laser comprises a stack of layers of semiconductor material, some of which may be quantum-well material. Layers of p-type 28 and n-type 29 material sandwich the active material 30 for each section of the laser (the laser in FIG. 4 has 2 sections), and ohmic contacts 31 and 32 provide connections to the p-contact and n-contact, respectively. Metalized region 33 provides ohmic contacts and a direct connection between the two sections. The light emitted is represented by the arrows labelled 34.

The operation of the laser according to the FIG. 4 embodiment of this invention and its advantages over conventional lasers can be easily understood if an n-section laser as shown in FIGS. 1-3 is compared with a conventional laser made from identical materials and identical active layer as the n-section laser and having identical overall dimensions, but having only one electrical contact for the entire active region in place of the n series-connected sections in the present laser.

Consider first the conventional laser. Each electron injected into the active region of the conventional laser from an external source produces one free carrier in the active region (for simplicity we will neglect leakage currents, but this does not alter the conclusions). On the other hand, in the present laser, since all n sections are connected in series, each electron injected into the n-section inventive laser from an external source causes one electron to pass through each of the n sections. Thus, each externally injected electron produces one free carrier in each of the n sections of the active region. The net effect is that each electron injected into the n-section laser produces a total of n free carriers in the entire active region (i.e., considering all sections together). As a result, the threshold current of the present laser is a factor of n less than the threshold current of the conventional laser, and the external quantum efficiency of the present laser is n times larger than for the conventional laser.

In conventional lasers, the external quantum efficiency is less than 100% due to leakage currents and optical losses in the cavity. These leakage currents and losses will also be present in the laser provided by this invention, but since the quantum efficiency is n times larger in the present laser, external quantum efficiencies in excess of 100% are possible.

A simple model is of assistance in explaining the properties of the laser of this invention and comparing it to a conventional laser. We begin by assigning values to the properties of the conventional laser with a single electrical contact. The conventional laser has a threshold current $I_{th}$, an external quantum efficiency of y, a series electrical resistance between its external contacts of R, and a terminal voltage at threshold of $V_{th}$.

As explained above, the present laser has a threshold current of $I_{th}/n$, and an external quantum efficiency of ny. Assume that the voltage across each section of the present laser is the same as the voltage across the conventional laser at threshold. Since the individual sections of the present laser are connected in series, the total voltage across the terminals of this laser at threshold is $nV_{th}$. The electrical power delivered to the laser at threshold is the product of the threshold current and the voltage across the terminals at threshold. This power is $I_{th}V_{th}$, which is identical to the electrical power delivered to the conventional laser at threshold.

Since each section of the present laser is n times shorter than the single section in the conventional laser, the contact area of each section is n times smaller than in the conventional laser. Thus, the resistance of each section is nR. Since each of these sections is connected in series, the total resistance of the laser at its external terminals is $n^2R$.

This increase in terminal resistance of the present laser compared with the conventional laser provides the opportunity to design a laser with prescribed input resistance. For example, a laser with an input resistance of 50 ohms could be designed using a structure in which R=5.5 ohms and n=3.

The present invention has been described above in terms of preferred embodiment lasers which generate a coherent optical signal with an intensity that is dependent on the drive current at the laser's terminals. If the laser is of the Fabry Perot type (i.e. if it does not contain any frequency control grating coupled to the active region), then the laser can be converted to an optical amplifier by the addition of anti-reflection coatings or other means such as angled facets. Anti-reflection coatings are shown in FIG. 3(a) by the broken lines 26b and 26c to the two facets of the laser. The anti-reflection coatings 26b and 26c quench lasing action, and light coupled in at one facet is amplified by the active region of the laser. The operation of semiconductor optical amplifiers (sometimes called semiconductor laser amplifiers) is well documented in the literature (see, for example, publications 1 and 12 hereinabove).

There are at least two main advantages provided by a presently preferred exemplary embodiment laser amplifier in accordance with the present invention over conventional optical amplifiers.

Firstly, in previous semiconductor amplifiers reported in the literature, the active device has been a single section device or a multiple-section device with the sections driven electrically in parallel. These structures are "conventional" optical amplifiers. The optical amplifier provided by the invention provides the same optical gain as a conventional optical amplifier with the same overall dimensions and semiconductor material, but operates at n times less drive current than the conventional optical amplifier.

Secondly, it is known that a semiconductor optical amplifier can operate as an optical detector while simultaneously amplifying the optical signal (see publication 13 referenced hereinabove). This detection capability arises because the carrier density in the optical amplifier, and hence the junction voltage, changes if the intensity of the injected optical signal changes. The optical amplifier provided by this invention also operates as a detector while simultaneously amplifying the input signal. However, it offers a significant advantage in detection responsivity over the conventional optical amplifier/detector. This arises because the junction voltage of each section of the optical amplifier will provide a change in junction voltage which is approximately the same as the change in junction voltage of the conventional optical amplifier. Since the n sections of the present optical amplifier are connected in series, the voltage changes across the n sections will add. Thus the optical amplifier/detector incorporating this invention will provide approximately n times the detection responsivity (in volts per watt) as the conventional amplifier/detector.

It will be evident from the description hereinabove that the present invention provides an improved semiconductor laser which provides considerable advantages over known such devices. It will also be apparent that the construction may be varied to provide for many different applications whilst still providing a laser which has greater quantum efficiency and lower threshold current.

The entire contents of the provisional specification lodged with Australian Patent Application of which this is the complete specification is hereby imported into this specification and forms part of the disclosure of this specification. The claims form part of the disclosure of this specification.

We claim:

1. A semiconductor laser comprising:
   a body of semiconductor material;
   plural double hetero junction laser sections defined in said body, said laser sections being electrically isolated from one another within said body, each of said plural laser sections having an active region, said active regions being optically coupled together; and
   connecting structure which electrically connects said plural laser sections together in series.

2. A semiconductor laser as in claim 1 wherein:
   each of said plural laser sections includes a p-layer and an n-layer; and
   said laser further includes electrical isolation means, disposed in said substrate, for electrically isolating each said p-layer from every other said p-layer, and for electrically isolating each said n-layer from every other said n-layer.

3. A semiconductor laser as in claim 1 wherein said body defines an outer surface, and said connecting structure comprises metallization means, disposed on said material outer surface, for electrically connecting said plural laser sections together in series.

4. A semiconductor laser as defined in claim 3 wherein said laser is constructed in planar form and said metalization means extends between an n-type cathode region of one said section and a p-type anode region of another said section, said metalization means extending into a well etched into said body in order to contact said n-type cathode region at the bottom of said well and extending to said outer surface in order to contact said p-type material, said n-type cathode region being planar and extending under, and to either side, of said active region.

5. A semiconductor laser as defined in claim 4 wherein said active region extends continuously through said plural laser sections between said cathode and anode of each section.

6. A semiconductor laser as in claim 1 wherein said connecting structure includes a power terminal connected to a first of said plural laser sections, said power terminal, in use, being coupled to an external drive current source, electrons injected into said semiconductor laser through said power terminal passing through each of said plural sections so as to produce a free carrier in each of said plural sections.

7. A semiconductor laser comprising:
   a body of semiconductor material;
   a first laser section defined in said body, said first laser section including a first n-layer and a first p-layer forming a first double hetero junction, a first active region being disposed at said first double hetero junction;
   a second laser section defined in said body, said second laser section including a second n-layer and a second p-layer forming a second double hetero junction, a second active region being disposed at said second double hetero junction, said second active region being closely optically coupled to said first active region;
   isolating structure disposed in said body for electrically isolating said first n-layer from said second n-layer; and
   means for electrically coupling said first p-layer to said second n-layer.

8. A semiconductor laser as in claim 7 wherein said isolating structure also electrically isolates said first p-layer from said second p-layer.

9. A semiconductor laser comprising:
   a body of semiconductor material;
   plural laser sections defined in said body, said laser sections comprising a stack of layers of semiconductor material forming a vertical-cavity surface emitting device, each of said plural laser sections having an active region, said active regions being optically coupled together; and
   connecting structure which electrically connects said plural laser sections together in series.

10. A semiconductor laser as defined in claim 9 wherein said body defines an outer surface, and said connecting structure comprises metallization means, disposed on said material outer surface, for electrically connecting said plural laser sections together in series.

11. A semiconductor laser as defined in claim 9 wherein said connecting structure includes a power terminal connected to a first of said plural laser sections, said power terminal, in use, being coupled to an external drive current source, electrons injected into said semiconductor laser through said power terminal passing through each of said plural sections so as to produce a free carrier in each of said plural sections.

* * * * *